(12) United States Patent
Noujeim

(10) Patent No.: US 8,898,526 B1
(45) Date of Patent: Nov. 25, 2014

(54) USING FORWARD ERROR CORRECTION CODING TO DIAGNOSE COMMUNICATION LINKS

(75) Inventor: Leesa Marie Noujeim, Los Altos, CA (US)

(73) Assignee: Google Inc., Mountain View, CA (US)

( * ) Notice: Subject to any disclaimer, the term of this patent is extended or adjusted under 35 U.S.C. 154(b) by 213 days.

(21) Appl. No.: 13/555,339

(22) Filed: Jul. 23, 2012

(51) Int. Cl.
| | |
|---|---|
| *G06F 11/00* | (2006.01) |
| *G01R 31/28* | (2006.01) |
| *H03M 13/00* | (2006.01) |
| *H04B 17/00* | (2006.01) |
| *G01R 31/08* | (2006.01) |
| *H03M 13/03* | (2006.01) |
| *H03M 1/08* | (2006.01) |
| *H03M 13/25* | (2006.01) |
| *H04L 1/00* | (2006.01) |
| *H04L 1/20* | (2006.01) |
| *H04L 12/26* | (2006.01) |
| *G01R 29/26* | (2006.01) |
| *G01R 31/317* | (2006.01) |

(52) U.S. Cl.
CPC ............ *H03M 13/03* (2013.01); *H03M 1/0836* (2013.01); *H03M 13/25* (2013.01); *H04L 1/0042* (2013.01); *H04L 1/205* (2013.01); *H04L 12/2665* (2013.01); *H04L 12/2602* (2013.01); *H04L 43/087* (2013.01); *H04L 43/0823* (2013.01); *G01R 29/26* (2013.01); *G01R 31/31709* (2013.01)
USPC ........... 714/704; 714/712; 714/752; 714/759; 714/784; 714/786; 714/821; 455/9; 455/226.1; 370/216; 370/242; 370/241

(58) Field of Classification Search
CPC ... H03M 13/03; H03M 13/25; H03M 1/0836; H04L 1/0042; H04L 1/205; H04L 12/2602; H04L 12/2665; H04L 43/0823; H04L 43/087; G01R 29/26; G01R 31/31709; H04W 28/04; H04W 8/30

USPC ......... 714/704, 712, 752, 759, 784, 786, 821; 455/9, 226.1; 370/216, 242, 241
See application file for complete search history.

(56) References Cited

U.S. PATENT DOCUMENTS

| | | | | |
|---|---|---|---|---|
| 7,058,876 | B1 * | 6/2006 | Ireland et al. | 714/781 |
| 7,840,220 | B1 * | 11/2010 | Mitchell | 455/452.2 |

(Continued)

OTHER PUBLICATIONS

Jitter Analysis: The dual-Dirac Model, RJ/DJ, and Q-Scale, Website: http://cp.literature.agilent.com/litweb/pdf/5989-3206EN.pdf, Agilent Technologies, Dec. 31, 2004.

(Continued)

*Primary Examiner* — John J Tabone, Jr.
(74) *Attorney, Agent, or Firm* — Lerner, David, Littenberg, Krumholz & Mentlik, LLP

(57) ABSTRACT

A communication link analyzer is disclosed for analyzing a communication link. The communication link analyzer may analyze bitstreams that have been FEC encoded and are transmitted according to one or more 10 Gigabit Ethernet standards, 40 Gigabit Ethernet standards, and other such standards. The communication link analyzer may maintain a running count of the errors detected for the bit positions of a 2112-bit FEC-encoded datablock. These errors may include, but are not limited to, baseline wander, deterministic jitter, and predictive-interval errors. When a given error threshold is met or exceeded for one or more received bitstreams, the communication link analyzer may then attempt a diagnosis of the communication link. Using previously provided empirical data, the communication link analyzer may provide a diagnosis of the communication link based on the error type threshold that was met or exceeded and the bit position associated with the error type threshold.

28 Claims, 5 Drawing Sheets

(56) References Cited

U.S. PATENT DOCUMENTS

| | | | |
|---|---|---|---|
| 7,930,616 B2* | 4/2011 | Gerstel et al. | 714/776 |
| 7,996,747 B2* | 8/2011 | Dell et al. | 714/776 |
| 8,037,394 B2* | 10/2011 | Djurdjevic et al. | 714/780 |
| 8,239,051 B2* | 8/2012 | Hataida | 700/94 |
| 2004/0259555 A1* | 12/2004 | Rappaport et al. | 455/446 |
| 2007/0116061 A1* | 5/2007 | Meagher et al. | 370/503 |
| 2007/0198904 A1* | 8/2007 | Yoshida | 714/785 |
| 2011/0167314 A1* | 7/2011 | Gerstel et al. | 714/752 |
| 2012/0311402 A1* | 12/2012 | Tseng et al. | 714/763 |

OTHER PUBLICATIONS

Mike Peng Li, "Jitter, Noise, and Signal Integrity at High-Speed," Chapter 1 and Chapter 9, Prentice Hall, Copyright 2008.

* cited by examiner

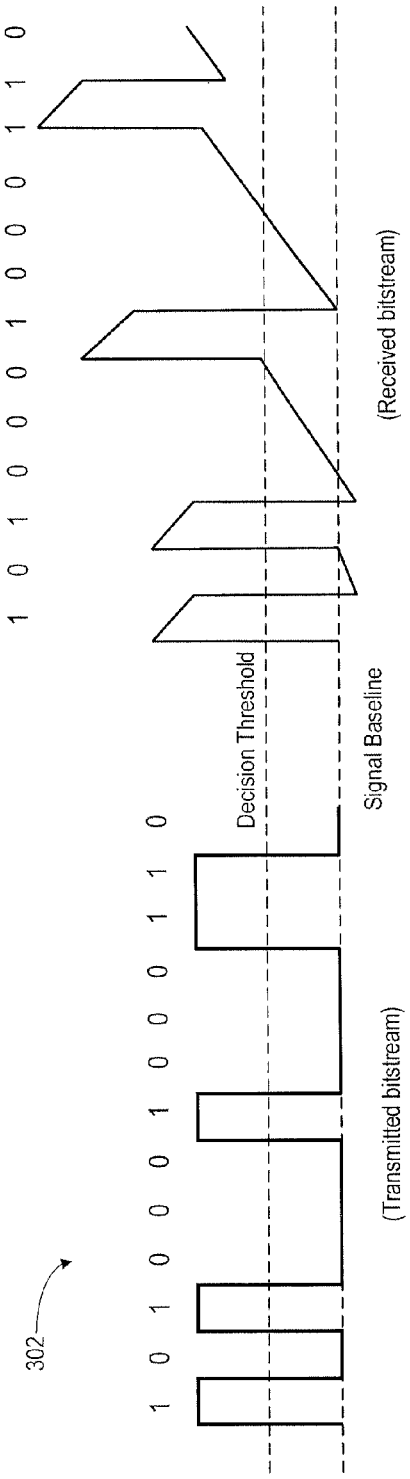

USING FORWARD ERROR CORRECTION CODING TO DIAGNOSE COMMUNICATION LINKS

BACKGROUND

Ten gigabit Ethernet ("10 GbE") is a version of Ethernet with a nominal data rate of 10 Gbit/s (billion bits per second). This standard defines full duplex point-to-point links, which are generally connected by network switches.

There are different transmission mediums that may carry a 10 GbE signal. One transmission medium is optical fiber. Various protocols define how a 10 GbE signal is to be carried over optical fiber, including 10GBASE-SR, 10GBASE-LR, and other such standards.

Another transmission medium is copper wiring. With copper wiring, a 10 GbE signal may be carried over twinaxial cabling, twisted pair cabling, and backplanes. A backplane (or "backplane system") is generally considered a group of connectors connected in parallel with each other, so that each pin of each connector is linked to the same relative pin of all the other connectors forming a computer bus. Standards that define 10 GbE transmission over a backplane include 10GBASE-KX4, 10GBASE-KR, and 40GBASE-KR4. These standards are defined by the Electrical and Electronics Engineers ("IEEE") 802.3 working group. In particular, these standards are defined by IEEE 802.3 clause 74.

One of the difficulties in communicating over copper wiring, and over a backplane system in particular, is that the transmitted bitstream may be corrupted when it reaches its destination. To compensate for errors in the transmitted bitstream, IEEE 802.3 clause 74 proposes a forward error correction ("FEC") coding technique.

In communication, forward error correction (FEC) is a coding technique used for controlling errors in data transmission over unreliable or noisy communication channels. The principle behind FEC is that a transmitter encodes its message in a redundant way by using an error-correcting code (ECC). The redundancy in the FEC encoded bitstream allows a receiver to detect an error that may occur in the bitstream, and then correct this error without retransmission. Under IEEE 802.3 clause 74, an FEC encoded bitstream typically contains datablocks of 2112 bits (32 datawords of 64 bits each plus 32 parity bits).

However, while an FEC encoded bitstream allows a receiver to recover erroneous blocks, there may be problems in the communication link that generated those errors. So long as the errors exist in the communication link, transmitted bitstreams may continuously include erroneous bits. By allowing the cause of the erroneous bits to persist, the likelihood increases that the receiver receives an unrecoverable bitstream and that vital communications may be delayed as a result.

SUMMARY

To address these and other problems, this disclosure provides for an apparatus for diagnosing a communication link carrying a bitstream that has been encoded using at least one forward error correction coding technique. In one embodiment, the apparatus may include a memory operative to store a bitstream error type database that may store at least one bitstream error type and a bitstream position database that may include an association of at least one bitstream error type with at least one bit position, wherein the association may identify at least one communication transmission cause. The apparatus may also include a processor in communication with the memory, the processor being operative to execute computer-readable instructions, which, when executed, may cause the processor to receive a bitstream of data transmitted over a communication link, wherein the bitstream of data may be encoded using at least one forward error correction coding technique. The processor may further detect an error in the bitstream of data based on the at least one forward error correction coding technique and may classify the error in the bitstream of data as the at least one bitstream error type based on information stored in the bitstream error type database. The processor may further determine a communication link diagnosis that may include the at least one communication transmission cause based on the classified error.

In another embodiment of the apparatus, the bitstream error type may include baseline wander.

In a further embodiment of the apparatus, the communication link diagnosis may include a diagnosis that a transmitter transmitting the bitstream of data is experiencing problem.

In yet another embodiment of the apparatus, the bitstream error type may include deterministic jitter.

In yet a further embodiment of the apparatus, the communication link diagnosis may include a diagnosis of signal interference within the communication link.

In another embodiment of the apparatus, the bitstream error type may include an error in the bitstream of data that occurs at fixed-length intervals of data bits.

In a further embodiment of the apparatus, the communication link diagnosis may include a diagnosis that a power supply within the communication link is experiencing a problem.

In yet another embodiment of the apparatus, the at least one bitstream error type may be based on a bit position for a bit in the bitstream of data.

In yet a further embodiment of the apparatus, the bitstream error type database may further store a plurality of bitstream error types, and the computer-readable instructions may further cause the processor to maintain an error count for each bitstream error type of the plurality of bitstream error types when an error in a received bitstream of data is received, and determine the communication link diagnosis based on the plurality of maintained error counts.

In another embodiment of the apparatus, the communication link diagnosis may be based on at least two bitstream error types.

In a further embodiment of the apparatus, the bitstream of data may be transmitted over the communication link according to the Institute of Electrical and Electronics Engineers 802.3 clause 74 protocol.

This disclosure also provides for a further apparatus for diagnosing a communication link carrying a bitstream that has been encoded using at least one forward error correction coding technique. In one embodiment, the apparatus may include a memory operative to store a bitstream error type database that stores at least one bitstream error type, and a bitstream position database that may include an association of at least one bitstream error type with at least one bit position, wherein the association identifies at least one communication transmission cause. The apparatus may also include a processor in communication with the memory, the processor being operative to execute computer-readable instructions, which, when executed, cause the processor to receive an error type for an error detected in a bitstream of data, wherein the bitstream of data may have been encoded based on at least one forward error correction coding technique. The processor may further receive a bit position for a bit where the error was detected in the bitstream of data and increase an error type count for the received bit position, wherein the error type count is associated with the received error type. When the error type count exceeds a predetermined error type count threshold, the processor may determine a communication link diagnosis that may include the at least one communication transmission cause based on the received error type.

In another embodiment of the apparatus, the bitstream error type may include baseline wander.

In a further embodiment of the apparatus, the communication link diagnosis may include a diagnosis that a transmitter transmitting the bitstream of data is experiencing problem.

In yet another embodiment of the apparatus, the bitstream error type may include deterministic jitter.

In yet a further embodiment of the apparatus, the communication link diagnosis may include a diagnosis of signal interference within the communication link.

In another embodiment of the apparatus, the bitstream error type may include an error in the bitstream of data that occurs at fixed-length intervals of data bits.

In a further embodiment of the apparatus, the communication link diagnosis may include a diagnosis that a power supply within the communication link is experiencing a problem.

In yet another embodiment of the apparatus, the communication link diagnosis may be based on at least two bitstream error types.

In yet a further embodiment of the apparatus, the bitstream of data may be transmitted over the communication link according to the Institute of Electrical and Electronics Engineers 802.3 clause 74 protocol.

This disclosure also provides for a method of diagnosing a communication link carrying a bitstream that has been encoded using at least one forward error correction coding technique. In one embodiment, the method may include establishing, in a computer-readable medium, a bitstream error type database that stores at least one bitstream error type and establishing, in the computer-readable medium, a bitstream position database comprising an association of at least one bitstream error type with at least one bit position, wherein the association may identify at least one communication transmission cause. The method may also include receiving, with a processor in communication with the computer-readable medium, a bitstream of data transmitted over a communication link, wherein the bitstream of data may be encoded using at least one forward error correction coding technique and detecting an error in the bitstream of data based on the at least one forward error correction coding technique. The method may also include classifying the error in the bitstream of data as the at least one bitstream error type based on information stored in the bitstream error type database, and determining a communication link diagnosis that may include the at least one communication transmission cause based on the classified error.

In another embodiment of the method, the bitstream error type may include baseline wander.

In a further embodiment of the method, the communication link diagnosis may include a diagnosis that a transmitter transmitting the bitstream of data is experiencing problem.

In yet another embodiment of the method, the bitstream error type may include deterministic jitter.

In another embodiment of the method, the communication link diagnosis may include a diagnosis of signal interference within the communication link.

In yet a further embodiment of the method, the bitstream error type may include an error in the bitstream of data that occurs at fixed-length intervals of data bits.

In another embodiment of the method, the communication link diagnosis may include a diagnosis that a power supply within the communication link is experiencing a problem.

In a further embodiment of the method, the bitstream error type database may further store a plurality of bitstream error types, and the method may further include maintaining an error count for each bitstream error type of the plurality of bitstream error types when an error in a received bitstream of data is received, determining the communication link diagnosis based on the plurality of maintained error counts.

BRIEF DESCRIPTION OF THE DRAWINGS

FIGS. 3A-3C illustrate various examples of types of errors that may be detected according to aspects of the disclosure.

DETAILED DESCRIPTION

The present disclosure relates to a communication link analyzer configured to diagnose a communication link where bitstream errors are encountered in a transmitted bitstream. In one example, the communication link is established among one or more backplane Ethernet transceivers and the communication link analyzer diagnoses the communication link based on the type of bitstream errors encountered by the backplane Ethernet transceivers.

Figure 1:
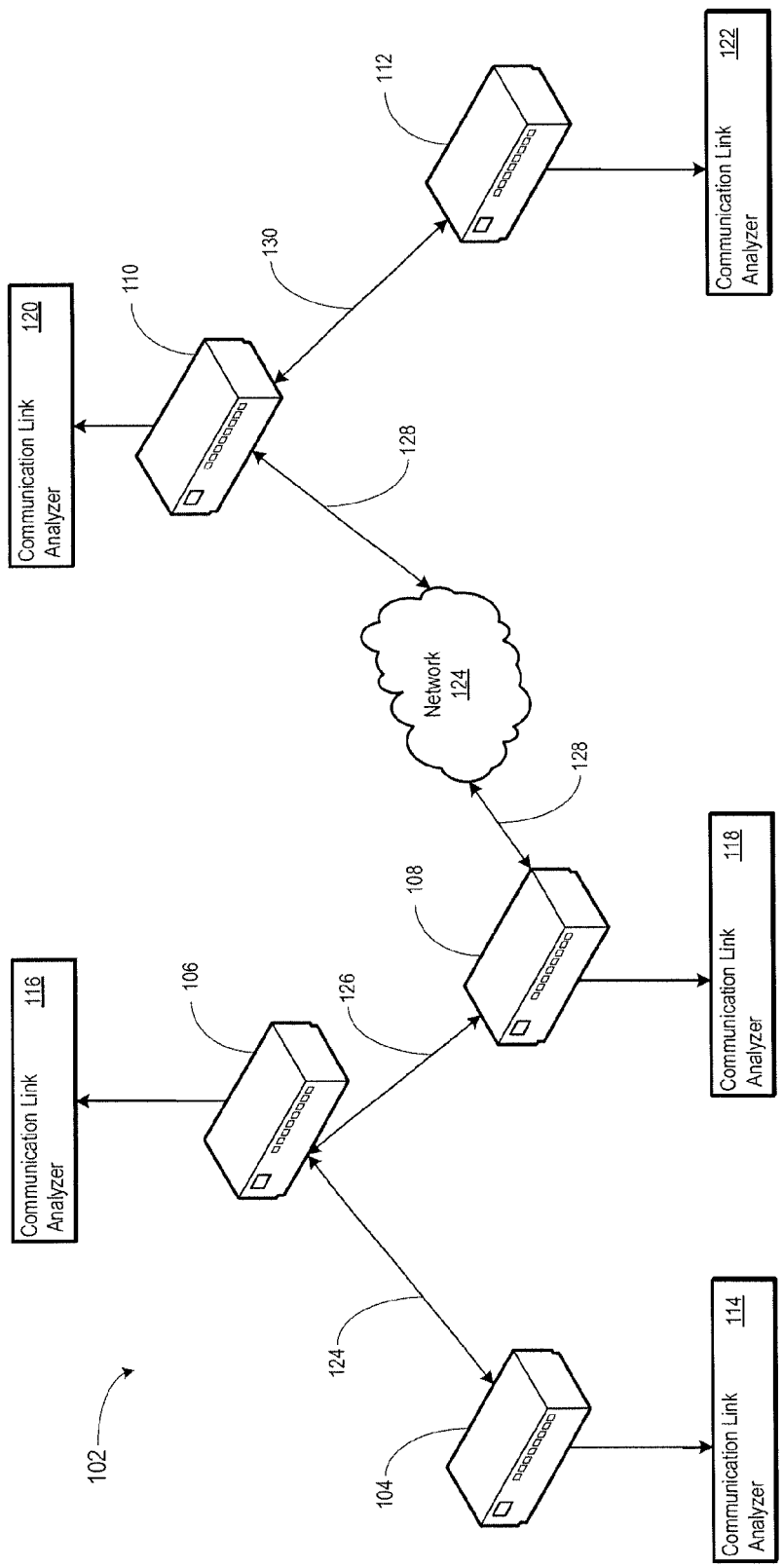
FIG. 1 illustrates one example of a communication system having various communication links over which a bitstream is transmitted according to aspects of the disclosure.

FIG. 1 illustrates one example of a communication system 102 where one or more transceivers 104-112 communicate a bitstream originating at a source transceiver 104 and being communicated to a destination transceiver 112. The communication system 102 may be a backplane Ethernet system in which the transceivers 104-112 communicate using one or more backplane Ethernet standards, such as 10GBASE-KR, or any other backplane Ethernet standard. Moreover, the transceivers 104-112 may communicate using additional or alternative standards or speeds, such as 40 Gbps standards or speeds. One example of a 40 Gbps standard is the 40GBASE-KR4 standards. Similar standards and/or speeds are also contemplated. The transceivers 104-112 may be any commercially available backplane Ethernet transceivers.

The transceivers 104-112 may communicate through a network 124. The network 124 may be any type of wired or wireless network. Examples of wired networks include Ethernet networks, Local Area Networks, Wide Area Networks, and other such wired networks. The network 124 may be established using any communication medium such as optical fiber, twisted pair cabling, twinaxial cabling, a backplane system, or any other such medium. Examples of wireless networks include networks established using any variant of IEEE 802.11, Bluetooth, WiMAX and other such wireless protocols. While current wireless network protocols do not support 10 GbE transfer rates, the present disclosure contemplates that such wireless standards will be adopted. Accordingly, the present disclosure applies to any such network 124 established between the transceivers 104-112 capable of transmitting a bitstream at 10 Gigabits per second ("Gbit/s") or faster.

In one example, each of the transceivers 104-112 may be in communication with a communication link analyzer 114-122. The communication link analyzer 114-122 analyzes the communication link established between two or more transceivers. The communication link analyzer may analyze a communication link based on a bitstream received by a transceiver in communication with the communication link analyzer. For example, the communication link analyzer may analyze the communication link 124 established between the transceiver 104 and the transceiver 106. In this example, the communication link analyzer 116 may analyze the communication link 124 as transceiver 106 is receiving (or after having received) a bitstream from transceiver 104. Similarly, the communication link analyzer 116 may analyze the communication link 126 as the transceiver 106 is receiving a bitstream from transceiver 108.

In this manner, each of the communication link analyzers may analyze (e.g., diagnose) a communication link for potential problems in transmitting a bitstream. More specifically, communication link analyzer 114 may analyze the communication link 124, communication link analyzer 116 may analyze communication links 124-126, communication link analyzer 118 may analyze communication links 126-128, communication link analyzer 120 may analyze communication links 128-130, and communication link analyzer 122 may analyze communication link 130.

While a communication link analyzer is shown in communication with each of the transceivers 104-112, it is possible that the communication system 102 has more or fewer communication link analyzers. For example, the communication system 102 has three "hops" between the transceiver 104 and transceiver 112 (e.g., transceiver 106, transceiver 108, and transceiver 110). Each of the "hops" has a communication link analyzer in communication with a transceiver, namely, communication link analyzers 116-120. In other examples of the communication system 102, it is possible that none of the "hops" have a communication link analyzer or that only one of the "hops" have a communication link analyzer. Of course, it is also possible that there are more communication link analyzers than "hops." For example, a single "hop" may have two or more communication link analyzers or a communication link analyzer may be interposed in a pathway within the communication link that is not technically a "hop." In this manner, a communication system may contain a number of communication link analyzers arranged in any type of configuration.

A communication link analyzer may analyze a communication link under a variety of conditions. Under one condition, the bitstream data transmitted through the communication system 102 is randomly generated. In this regard, the transceiver 104 may be configured to generate a pseudo-random bitstream of data and transmit the pseudo-random bitstream of data to the transceiver 112 using an FEC encoding. Alternatively, a pseudo-random bit generator (not shown) may be in communication with the transceiver 104 and the transceiver 104 may transmit the output of the pseudo-random bit generator using the FEC encoding. With a pseudo-random bit generator, the communication links 124-130 may be analyzed (e.g., diagnosed for potential problems) without the worry that the analysis may impact "live" traffic or affect potential users of the communication system 102.

Under another condition, the communication link analyzers 114-122 may analyze the communication system 102 under "live" conditions. In this regard, the transceiver 104 may be in communication with a server or other computer that is outputting a bitstream in real-time, and the transceiver 104 may transmit the outputted bitstream to the transceiver 112. Examples of "live" conditions include the transmission of high-definition video, movie and/or television broadcasts, dense server traffic, or other such transmissions. In some situations, the transceiver 104 may be transmitting both "live" and pseudo-random generated bitstreams.

While the foregoing discussion has focused on the transmission of the transceiver 104, it should be understood that any one of the transceivers 104-112 may initiate the transmission of a bitstream. Moreover, it should be understood that the transmission may be bi-directional; for example, transceiver 104 may both transmit a bitstream to, and receive a bitstream from, another transceiver, such as transceiver 112.

As a bitstream is received by a transceiver, the transceiver may decode the FEC encoding of the bitstream to determine if there are any errors in the bitstream. When an error is detected in the bitstream, the transceiver may correct the bitstream. The transceiver may then report various statistical information about the error to a communication link analyzer. The statistical information may include the error, the type of error, the bit position of the error (e.g., which bit(s) was/were incorrect), and other such statistical information. As discussed below, the communication link analyzer may use this statistical information to determine a diagnosis for a given communication link.

Although shown as separate entities, a transceiver and a communication link analyzer may be the same entity. For example, while communication link analyzer 114 and transceiver 104 are shown separately, the communication link analyzer 114 and the transceiver 104 may be the same entity. Moreover, a communication link analyzer may be operative to decode a received bitstream where a transceiver is unable to communicate the statistical information discussed above. In this scenario, a communication link analyzer 114 may include one or more components typically found in a transceiver for decoding an FEC encoded bitstream (e.g., the physical medium attachment sublayer components, an FEC decoder, the physical coding sublayer components, etc.).

Figure 2:
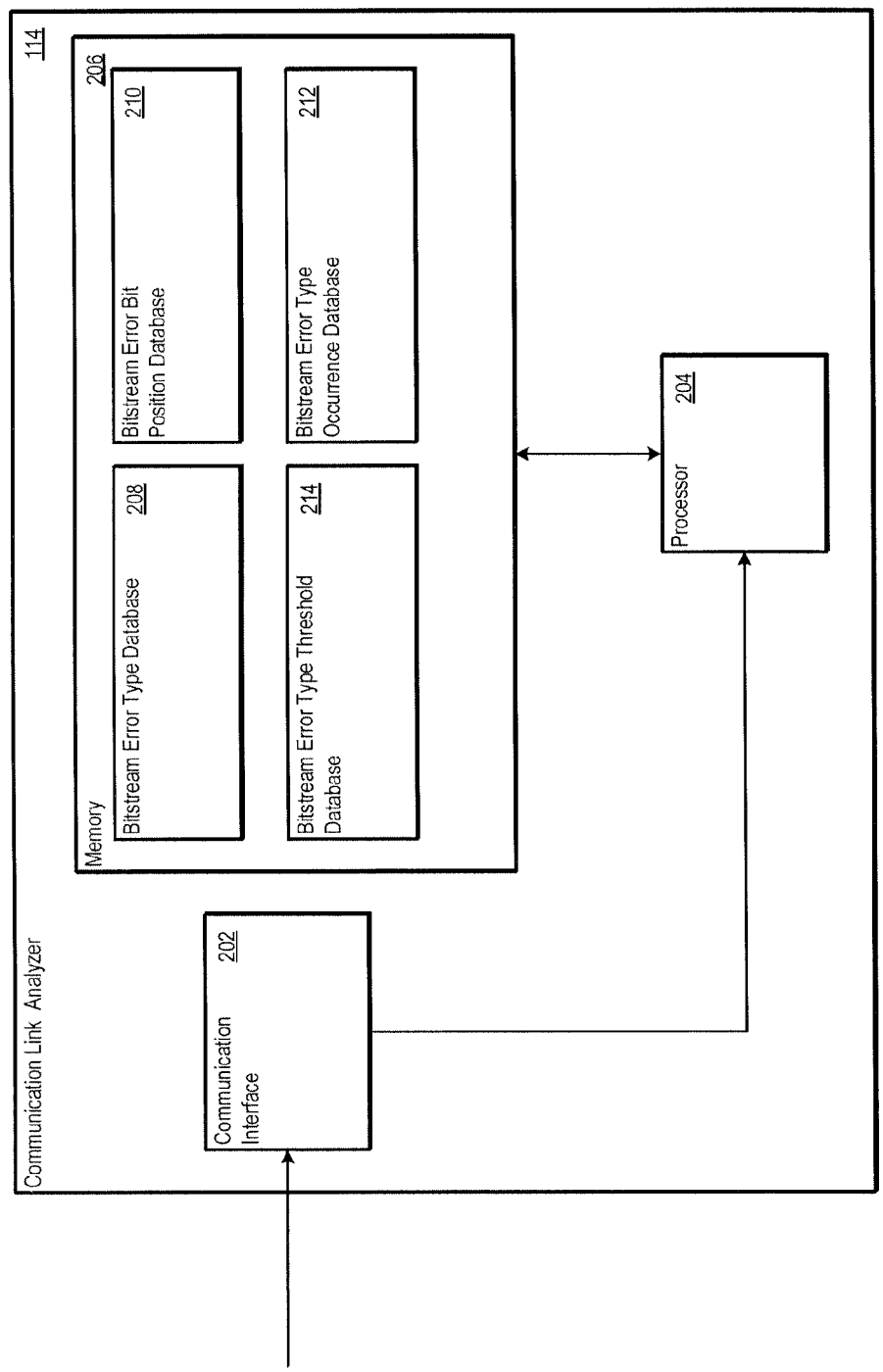
FIG. 2 illustrates an example of a communication link analyzer according to aspects of the disclosure.

FIG. 2 illustrates one example of a communication link analyzer 114. The communication link analyzer 114 may include a communication interface 202, a processor 204, and a memory 206. In other implementations, the communication link analyzer 114 may include components for decoding an FEC-encoded bitstream transmitted using a 10 GbE standard (e.g., 10GBASE-KR, 10GBASE-SR, etc.).

The communication interface 202 may be operative to communicate with a transceiver (e.g., transceiver 104) and receive the statistical information previously discussed. The communication interface 202 may be a Universal Serial Bus ("USB") interface, a serial interface, a parallel-port interface, an IEEE 1394 interface, an external Serial Advanced Technology Attachment ("e-SATA") interface, or any other such interface operative to receive information from a transceiver.

The processor 204 may be any conventional processor or microprocessor, such as processors from Intel Corporation or Advanced Micro Devices. Alternatively, the processor 204 may be a dedicated device such as an application-specific integrated circuit ("ASIC"). Although FIG. 2 functionally illustrates the processor 204, the memory 206, and other elements of the communication link analyzer 114 as being within the same block, it will be understood by those of ordinary skill in the art that the processor 204 and the memory 206 may actually comprise multiple processors and memories that may or may not be stored within the same physical housing. For example, the memory 206 may be a hard drive or other storage media located in a housing different from that of the communication link analyzer 114. Accordingly, references to a processor, memory, the communication link analyzer 114, or a computer will be understood to include references to a collection of processors or computers or memories that may or may not operate in parallel. Rather than using a single processor to perform the operations described herein, some of the components may each have their own processor that perform operations related to the component's specific function.

The memory 206 may be of any type of memory operative to store information accessible by the processor 204, including a computer-readable medium, or other medium that stores data that may be read with the aid of an electronic device, such as a hard-drive, memory card, read-only memory ("ROM"), random-access memory ("RAM"), an electrically erasable programmable read-only memory ("EEPROM"), one or more a digital video disc ("DVD") or other optical disks, as well as other write-capable and read-only memories. Systems and methods may include different combinations of the foregoing, whereby different portions of the software functionalities of the communication link analyzer 114 are stored on different types of media.

The memory 206 may include any set of computer-executable instructions to be executed directly (such as machine code) or indirectly (such as scripts) by the processor 204. For example, the computer-executable instructions may be stored as computer code on a computer-readable medium. In that regard, the terms "instructions," "programs," and "applications" may be used interchangeably herein. The instructions may be stored in object code format for direct processing by the processor 204, or in any other computer language including scripts or collections of independent source code modules that are interpreted on demand or compiled in advance. Functions, methods and routines of these instructions are explained in more detail below.

The communication link analyzer 114 may include one or more databases 208-214 for analyzing a given communication link. The information stored within the databases 208-214 may be may be retrieved, stored or modified by processor 332. For instance, although systems and methods disclosed herein are not limited by any particular data structure, the databases 208-214 may be stored in computer registers, as one or more relational databases defined by a table having a plurality of different fields and records, Extensible Markup Language ("XML") documents, flat files, or combinations thereof. The databases 208-214 may also be formatted in any computer-readable format. In addition, the databases 208-214 may comprise any information sufficient to identify the relevant information, such as numbers, descriptive text, proprietary codes, references to data stored in other areas of the same memory or different memories (including other network locations) or information that is used by a function to calculate the relevant data.

In various examples described herein, the processor 204 may be located remote from the communication link analyzer 114 and may communicate with one or more components, such as the memory 206 and/or the communication interface 202, wirelessly over a network (e.g., a local area network, a wide area network, etc.). In addition, one or more of the components may be housed within other servers or computers, and the communication link analyzer 114 may receive information from those components. For example, one or more databases 208-214 may be stored in another server or computer and the processor 204 may receive information from each of these other servers and/or computers. In other aspects, some of the processes described herein are executed on a processor disposed within the communication link analyzer 114 and others by a remote processor housed within a server being monitored, including performing operations for diagnosing and/or analyzing a given communication link.

The communication link analyzer 114 may include a bitstream error type database 208. The bitstream error types may include such bitstream error types as a baseline wander error type, a deterministic jitter error type, a predictive-interval error type, a lone-one-flipped error type, a lone-zero-flipped error type, and other such error types. The bitstream error type database 208 may include deterministic information about the error types stored in the bitstream error type database 208, such as identification information. The bitstream error type database 208 may be leveraged by the communication link analyzer 114 where the communication link analyzer 114 receives an error code from a transceiver, and the communication link analyzer 114 may use the error code to retrieve a corresponding error type from the bitstream error type database 208.

The bitstream error bit position database 210 may include information about errors that occur at various bit positions. Using empirical data, the bitstream error bit position database 210 may be populated with the type of errors expected at given bit positions and the causes of those types of errors. For example, the empirical data may indicate that if baseline wander is detected at bit position 1404, then the possible causes of the baseline wander include temperature fluctuations, a loose connection, or poor insulation. As another example, the empirical data may indicate that if deterministic jitter is detected at bit position 1304, then the possible causes of the deterministic jitter in the communication link may include interference, cross-talk, or electro-magnetic radiation.

The bitstream error bit position database 210 may be leveraged by the communication link analyzer 114 as errors are detected in received bitstreams. As discussed below, when a bitstream error type threshold is reached or exceeded for a given bitstream error type and/or a given bitstream bit position, the communication link analyzer 114 may refer to the bitstream error bit position database 210 to provide a diagnosis of the communication link from which the bitstream received.

The bitstream error type occurrence database 212 may retain information about the error types detected in received bitstreams. Depending on the level of granularity implemented by the communication link analyzer 114, the bitstream error type occurrence database 212 may retain error information on a per bit position level, on a per datablock level, on a per bitstream level, or a combination thereof. In other implementations, the communication link analyzer 114 may maintain a total error count, such that the error count is increased regardless of the detected error.

With regard to the per bit position level, when an error is detected in the bitstream, the communication link analyzer 114 may increase the error count for the associated error type with the associated bit position. For example, suppose that a baseline wander error is detected at bit position 1404 of a 2112-bit datablock for a received FEC-encoded bitstream. In this example, the communication link analyzer 114 may increase the baseline wander error count for the 1404 bit position. Similarly, where a deterministic jitter error is detected at bit position 304 of a 2112-bit datablock for a received FEC-encoded bitstream, the communication link analyzer 114 may increase the deterministic jitter error count for the bit position 304.

Furthermore, the communication link analyzer 114 may maintain a total error count for errors detected at a given bit position. Thus, regardless of the error type detected at a given bit position, the communication link analyzer 114 may increase the error count for that given bit position.

With regard to maintaining an error count on a per datablock basis, the communication link analyzer 114 may increase an error count for a given error type each time the error type is detected in a datablock. For example, suppose that a deterministic jitter error is detected at bit positions 304-403 of a single 2112-bit datablock. In this example, the communication link analyzer 114 may increase the error count for the deterministic jitter error type by 100. Alternatively, the communication link analyzer 114 may increase the error count for the deterministic error type by only 1, since only one datablock was detected as having deterministic jitter. In this alternative implementation, the communication link analyzer 114 may only increase the error count by one for a given error type when an error is detected within a 2112-bit datablock, regardless of the number of times the error actually occurs within the datablock.

Furthermore, the communication link analyzer 114 may maintain a total error count for errors detected within a given datablock. Thus, regardless of the error type detected within the given datablock, the communication link analyzer 114 may increase the error count for that datablock (e.g., the communication link analyzer 114 may increase the same error count when baseline wander and deterministic jitter are detected within the same datablock).

With regard to the bitstream level, the communication link analyzer 114 may increase an error count for a given error type or a total error count for all error types whenever a bitstream is received erroneously. In this example, even if each 2112-bit datablock of a bitstream contains erroneous bits, the communication link analyzer 114 may increase the error type count or the total error count by one. With this implementation, the communication link analyzer 114 focuses on the bitstream as a whole rather than on its constituent elements.

Of course, the communication link analyzer 114 may retain error information in combinations of the foregoing. That is, the communication link analyzer 114 may maintain an error type count for each bit position, a total error count for each bit position, an error type count for each error detected within a 2112-bit datablock, a total error count for the number of errors detected within a 2112-bit datablock, an error type count when a bitstream is detected as having a given error, and a total error count for the total number of different errors detected within a bitstream. In this regard, the communication link analyzer 114 retains various statistical information about the errors detected within a bitstream to facilitate in the diagnosis of the communication link about the potential causes of the detected errors.

The bitstream error type threshold database 214 may store various bitstream error type thresholds for various error types. For example, the bitstream error type thresholds may include a deterministic jitter error type threshold, a baseline wander error type threshold, a predictive-interval error type threshold, and other such thresholds. In addition, the bitstream error type thresholds may vary depending on the granularity of the bitstream error counts maintained by the communication link analyzer 114. For example, there may be bitstream error type thresholds for each bit position of a 2112-bit datablock, bitstream error type thresholds for datablocks as a whole, bitstream error type thresholds for a bitstream as a whole, and other such bitstream error type thresholds.

The bitstream error type thresholds may be relative, absolute, or a combination thereof. With regard to absolute bitstream error type thresholds, the bitstream error type thresholds may refer to the number of times a particular error occurred (e.g., the deterministic jitter error type occurred fifty time). With regard to relative bitstream error type thresholds, the bitstream error type thresholds may refer to a percentage of errors that occurred (e.g., the deterministic jitter error was detected 50% of the time). For relative bitstream error type thresholds, the communication link analyzer 114 may retain the number of bits received, the number of bits received for a given bit position, the number of datablocks received, the number of bitstreams received, or any other such statistical information.

The bitstream error type thresholds may be established through empirical testing or the like. For example, a communication system may be tested using pseudo-random generated bitstreams and the resulting errors may be recorded in order to establish the bitstream error type thresholds. Alternatively, or in addition, the communication system 102 may be tested using one or more pseudo-random generated bitstreams to establish the bit stream error type thresholds. Furthermore, the bitstream error type thresholds may be adjustable (downwards or upwards) in order to avoid the false diagnosis of a given communication link.

The communication link analyzer 114 may compare the stored bitstream error type counts (e.g., occurrences) stored in the bitstream error type occurrence database 212 with the bitstream error type thresholds stored in the bitstream error type threshold database 214. When a bitstream error type threshold is met or exceeded, the communication link analyzer 114 may then provide a diagnosis for a given communication link. To provide the diagnosis, the communication link analyzer 114 may refer to the bitstream error bit position database 210. The communication link analyzer 114 may query the bitstream error bit position database 210 with the error type and bit position of the exceeded (or met) bitstream error type to provide a diagnosis.

For example, suppose that the deterministic jitter error type threshold is met or exceeded for bit position 1404. The communication link analyzer 114 may query the bitstream error bit position database 210 with the error type (deterministic jitter) and the bit position (1404). In return, the bitstream error bit position database 210 may provide that poor shielding and cross-talk are the most likely causes for deterministic jitter caused at bit position 1404.

Multiple causes of errors for a given communication link are also possible. For example, suppose that the baseline wander error type threshold is met or exceeded for bit position 1404 and that the predictive-interval error type threshold is met or exceeded for bit position 308. In this example, the communication link analyzer may query the bitstream error bit position database 210 with the error types (baseline wander and predictive-interval) with their associated bit positions (1404 and 308). The bitstream error bit position database 210 may provide that the likely causes of the errors are a loose connection and a fluctuating power supply. An operator may then query the communication link analyzer 114 to obtain the diagnosis. Alternatively, the communication link analyzer 114 may automatically communicate the diagnosis.

Figure 3C:
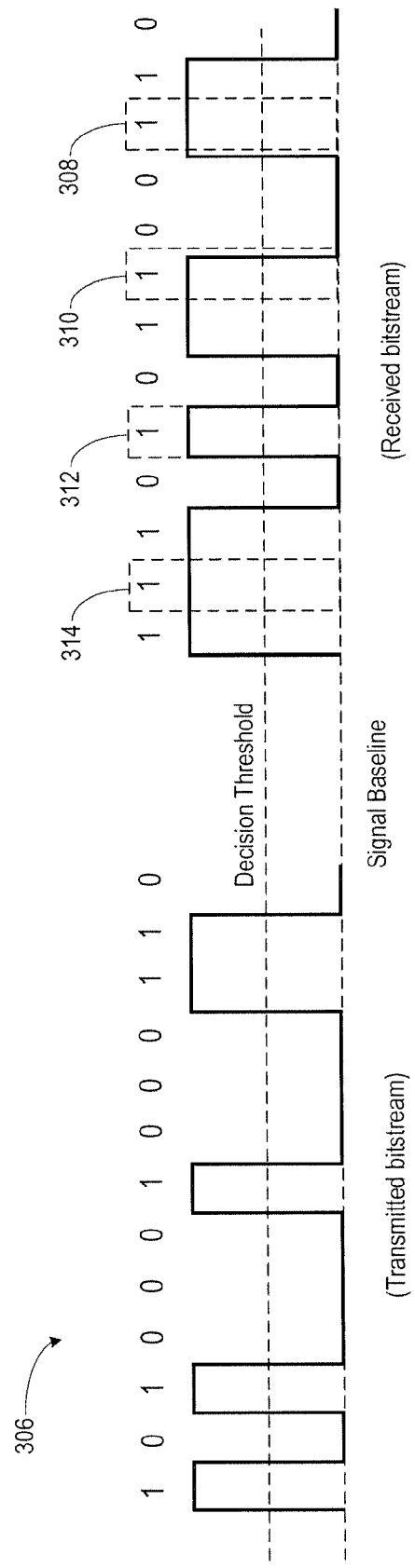

FIGS. 3A-3C illustrate various examples of the types of errors that may be detected according to aspects of the disclosure. Although FIGS. 3A-3C illustrate less than 2112 bits (e.g. the number of bits typically found in an FEC-encoded datablock), it should be understood that the number of bits is merely illustrative and does not reflect the actual number of bits that may be received by a transceiver and/or a communication link analyzer.

FIG. 3A illustrates an example 302 of a baseline wander error type. In the example 302, a bitstream may be transmitted at a first amplitude, but the received bitstream gradually increases in amplitude. In this regard, values that were initially transmitted at "0" are ultimately received as a value of "1".

FIG. 3B illustrates an example 304 of a deterministic jitter error type. In the example 304, a bitstream is received slightly out of synchronization than what was expected. Deterministic jitter may affect whether a given bit is detected by a transceiver and/or a communication link analyzer.

Although not shown in FIG. 3B, a lone-one-flipped error type or a lone-zero-flipped error type may be considered a type of deterministic jitter. In a lone-one-flipped error or a lone-one-flipped error, a single one or a single zero among a group of zeros or a group of ones, respectively, is inadvertently flipped and not received. For a lone-one-flipped error, the bitstream may include "0001000," but a receiver may receive "0000000," where the lone one in the sequence has been flipped. For a lone-zero-flipped error, the bitstream may include "1110111," but a receiver may receiver "1111111," where the lone zero in the sequence has been flipped.

FIG. 3C illustrates an example 306 of a predictive-interval error type. In the example 306, a fixed-length intervals of data bits (e.g., every third bit position 308-314) of a received bitstream is received with a value of "1," regardless of whether the bit position contained a "1" or "0". Like a baseline wander error type, a predictive-interval error type may affect whether a transceiver and/or a communication link analyzer detects a bit correctly as a "0" or as "1".

Figure 4:
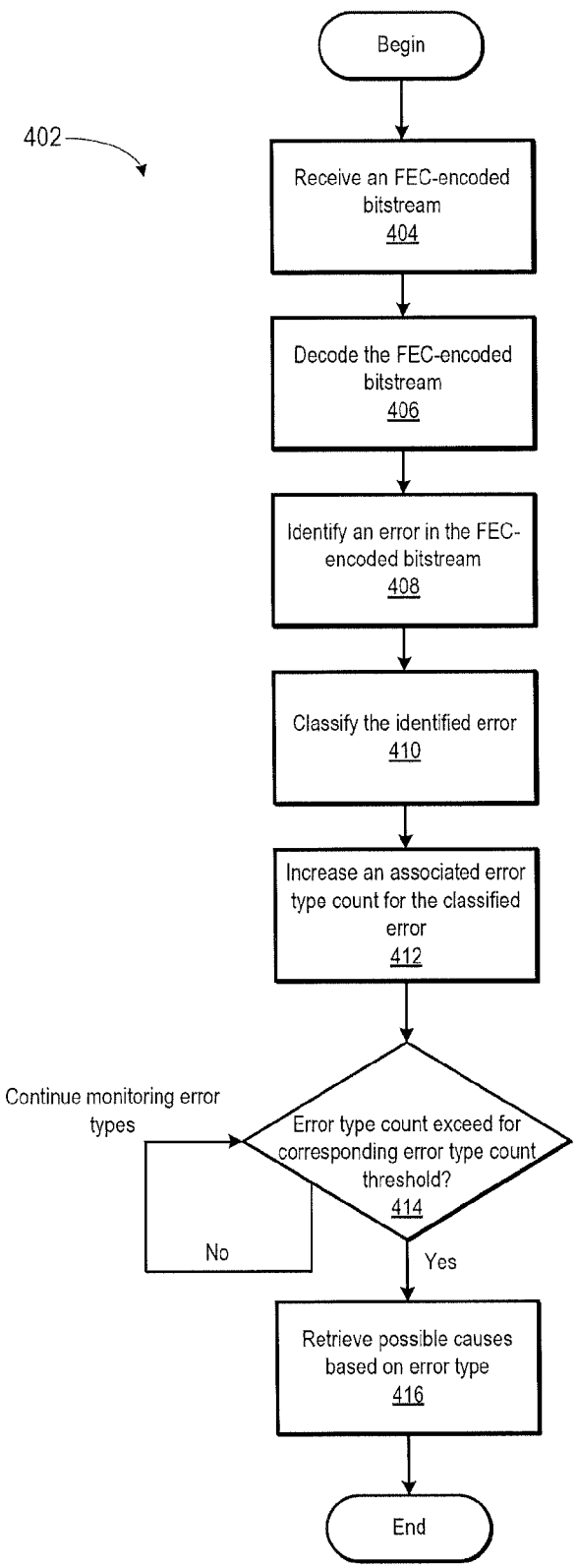
FIG. 4 illustrates an example of logic flow for diagnosing a communication link according to aspects of the disclosure.

FIG. 4 illustrates an example of logic flow 402 for diagnosing a communication link according to aspects of the disclosure. While the following operations are described as being performed in a given order, it should be understood that any one of these operations may be performed in a different order, and that one or more operations may be added or omitted without departing from the objective of diagnosing a communication link based on a detected error type.

Initially, an FEC-encoded bitstream is received (Block 404). The FEC-encoded bitstream may then be decoded (Block 406). An error may be identified in the decoded DataStream (Block 408). The error may then be classified (Block 410). The receipt (Block 404), decoding (Block 406), error identification of an error in a received bitstream (Block 408), and classification of said error (Block 410) may be performed by a transceiver, a communication link analyzer, or a combination of both.

An error type count associated with the classified error may then be increased (Block 412). As previously discussed, increasing the error type count may depend on the granularity of the error type counts stored and/or maintained in the bitstream error type occurrence database 212. The number of received bits, datablocks, and/or bitstreams may also be stored and/or maintained.

One or more of the error type counts may then be compared with one or more corresponding error type count thresholds (Block 414). As previously discussed, the one or more error type count thresholds may be relative, absolute, or a combination thereof. A determination is then made as to whether a given error type count is equal to or exceeds its associated error type count threshold.

Where an error type count threshold is met or exceeded, a diagnosis for the communication link is then performed (Block 416). In this regard, possible causes for errors in the bitstream may be retrieved from the bitstream error bit position database 210 based on the error types associated with the met or exceeded error type count thresholds and/or the one or more bit positions associated with the met or exceeded error type count thresholds. Alternatively, a diagnosis may be performed without taking into account the bit position for the met or exceeded error type count threshold. One or more of the error type counts may then be reset, including error type counts associated with the met or exceeded error type count thresholds and/or error type counts not associated with the met or exceeded error type count thresholds. An operator may then query the communication link analyzer to obtain the diagnosis. Alternatively, the communication link analyzer may automatically communicate the diagnosis.

Accordingly, this disclosure provides for a communication link analyzer operative to diagnose a given communication link. The communication link analyzer disclosed herein is particularly advantageous since it provides for a diagnosis of a communication link at the bit level. With bit-level knowledge of potential problems in a communication link, an operator or user of the communication link can quickly and readily address problems that may have not been previously identified. Moreover, with bit-level knowledge, the operator or user of the communication link can increase the operating efficiency of the communication link based on the potential problems identified by the communication link analyzer. Thus, the disclosed communication link analyzer exhibits a distinct advantage over simply identifying whether an error occurred in an FEC-encoded bitstream.

As these and other variations and combinations of the features discussed above can be utilized without departing from the subject matter as defined by the claims, the foregoing description should be taken by way of illustration rather than by way of limitation of the subject matter as defined by the claims. It will also be understood that the provision of the examples described herein (as well as clauses phrased as "such as," "e.g.", "including" and the like) should not be interpreted as limiting the claimed subject matter to the specific examples; rather, the examples are intended to illustrate only some of many possible aspects.

The invention claimed is:

1. An apparatus for diagnosing a communication link carrying a bitstream that has been encoded using at least one forward error correction coding technique, the apparatus comprising:
   a memory operative to store:
      a bitstream error type database that stores at least one bitstream error type; and
      a bitstream position database comprising an association of at the least one bitstream error type with at least one bit position, wherein the association identifies at least one communication transmission cause; and
   a processor in communication with the memory, the processor being operative to execute computer-readable instructions, which, when executed, cause the processor to:
      receive a bitstream of data transmitted over a communication link, wherein the bitstream of data is encoded using at least one forward error correction coding technique;
      detect an error in the bitstream of data based on the at least one forward error correction coding technique;
      classify the error in the bitstream of data as the at least one bitstream error type based on information stored in the bitstream error type database; and
      determine a communication link diagnosis that comprises the at least one communication transmission cause based on the classified error.

2. The apparatus of claim 1, wherein the at least one bitstream error type comprises baseline wander.

3. The apparatus of claim 2, wherein the communication link diagnosis comprises a diagnosis that a transmitter transmitting the bitstream of data is experiencing a problem.

4. The apparatus of claim 1, wherein the at least one bitstream error type comprises deterministic jitter.

5. The apparatus of claim 4, wherein the communication link diagnosis comprises a diagnosis of signal interference within the communication link.

6. The apparatus of claim 1, wherein the at least one bitstream error type comprises an error in the bitstream of data that occurs at fixed-length intervals of data bits.

7. The apparatus of claim 6, wherein the communication link diagnosis comprises a diagnosis that a power supply within the communication link is experiencing a problem.

8. The apparatus of claim 1, wherein the at least one bitstream error type is based on a bit position for a bit in the bitstream of data.

9. The apparatus of claim 1, wherein:
the bitstream error type database further stores a plurality of bitstream error types;
the computer-readable instructions further cause the processor to:
maintain an error count for each bitstream error type of the plurality of bitstream error types when an error in a received bitstream of data is received; and
determine the communication link diagnosis based on the plurality of maintained error counts.

10. The apparatus of claim 1, wherein the communication link diagnosis is based on at least two bitstream error types.

11. The apparatus of claim 1, wherein the bitstream of data is transmitted over the communication link according to the Institute of Electrical and Electronics Engineers 802.3 clause 74 protocol.

12. An apparatus for diagnosing a communication link carrying a bitstream that has been encoded using at least one forward error correction coding technique, the apparatus comprising:
a memory operative to store:
a bitstream error type database that stores at least one bitstream error type; and
a bitstream position database comprising an association of at the least one bitstream error type with at least one bit position, wherein the association identifies at least one communication transmission cause; and
a processor in communication with the memory, the processor being operative to execute computer-readable instructions, which, when executed, cause the processor to:
receive an error type for an error detected in a bitstream of data based on information in the bitstream error type database, wherein the bitstream of data was encoded based on at least one forward error correction coding technique;
receive a bit position for a bit where the error was detected in the bitstream of data;
increase an error type count for the received bit position, wherein the error type count is associated with the received error type; and
when the error type count exceeds a predetermined error type count threshold, determine a communication link diagnosis that comprises the at least one communication transmission cause based on the received error type.

13. The apparatus of claim 12, wherein the at least one bitstream error type comprises baseline wander.

14. The apparatus of claim 13, wherein the communication link diagnosis comprises a diagnosis that a transmitter transmitting the bitstream of data is experiencing a problem.

15. The apparatus of claim 12, wherein the at least one bitstream error type comprises deterministic jitter.

16. The apparatus of claim 15, wherein the communication link diagnosis comprises a diagnosis of signal interference within the communication link.

17. The apparatus of claim 12, wherein the at least one bitstream error type comprises an error in the bitstream of data that occurs at fixed-length intervals of data bits.

18. The apparatus of claim 17, wherein the communication link diagnosis comprises a diagnosis that a power supply within the communication link is experiencing a problem.

19. The apparatus of claim 12, wherein the communication link diagnosis is based on at least two bitstream error types.

20. The apparatus of claim 12, wherein the bitstream of data is transmitted over the communication link according to the Institute of Electrical and Electronics Engineers 802.3 clause 74 protocol.

21. A method for diagnosing a communication link carrying a bitstream that has been encoded using at least one forward error correction coding technique, the method comprising:
establishing, in a non-transitory computer-readable medium, a bitstream error type database that stores at least one bitstream error type;
establishing, in the non-transitory computer-readable medium, a bitstream position database comprising an association of the at least one bitstream error type with at least one bit position, wherein the association identifies at least one communication transmission cause;
receiving, with a processor in communication with the computer-readable medium, a bitstream of data transmitted over a communication link, wherein the bitstream of data is encoded using at least one forward error correction coding technique;
detecting an error in the bitstream of data based on the at least one forward error correction coding technique;
classifying the error in the bitstream of data as the at least one bitstream error type based on information stored in the bitstream error type database; and
determining a communication link diagnosis that comprises the at least one communication transmission cause based on the classified error.

22. The method of claim 21, wherein the at least one bitstream error type comprises baseline wander.

23. The method of claim 22, wherein the communication link diagnosis comprises a diagnosis that a transmitter transmitting the bitstream of data is experiencing a problem.

24. The method of claim 21, wherein the at least one bitstream error type comprises deterministic jitter.

25. The method of claim 24, wherein the communication link diagnosis comprises a diagnosis of signal interference within the communication link.

26. The method of claim 21, wherein the at least one bitstream error type comprises an error in the bitstream of data that occurs at fixed-length intervals of data bits.

27. The method of claim 26, wherein the communication link diagnosis comprises a diagnosis that a power supply within the communication link is experiencing a problem.

28. The method of claim 21, wherein the bitstream error type database further stores a plurality of bitstream error types, and the method further comprises:
maintaining an error count for each bitstream error type of the plurality of bitstream error types when an error in a received bitstream of data is received; and
determining the communication link diagnosis based on the plurality of maintained error counts.

* * * * *